United States Patent [19]
van der Plaats

[11] Patent Number: 5,923,462
[45] Date of Patent: Jul. 13, 1999

[54] DYNAMIC GAIN CONTROL SYSTEM FOR OPTICAL AMPLIFIER AND METHOD THEREOF

[75] Inventor: Johannes Christiaan van der Plaats, Maarsen, Netherlands

[73] Assignee: Lucent Technologies Inc., Murray Hill, N.J.

[21] Appl. No.: 08/828,444

[22] Filed: Mar. 28, 1997

[51] Int. Cl.$^6$ ................................................. H01S 3/00
[52] U.S. Cl. ......................................... 359/341; 359/177
[58] Field of Search ................................. 359/341, 177

[56] References Cited

U.S. PATENT DOCUMENTS

| | | | |
|---|---|---|---|
| 5,268,786 | 12/1993 | Matsushita et al. | 359/341 |
| 5,374,973 | 12/1994 | Maxham et al. | 359/341 |
| 5,541,766 | 7/1996 | Mizrahi et al. | 359/337 |
| 5,563,732 | 10/1996 | Erdogan et al. | 359/341 |
| 5,633,750 | 5/1997 | Nogiwa et al. | 359/341 |
| 5,721,636 | 2/1998 | Erdogan et al. | 359/341 |

FOREIGN PATENT DOCUMENTS

| | | | |
|---|---|---|---|
| 02273976 | 11/1990 | Japan | 3/6 |
| 02308581 | 12/1990 | Japan | 3/6 |

OTHER PUBLICATIONS

Srivastava, et al., "Fast Gain Control In An Erbium–Doped Fiber Amplifier," OSA Tops On Optical Amplifiers And Their Applications, vol. 5, 1996, pp. 24–27, XP002076163 P. 224, line 17–line 28; figure 1.
European Search Report.
"Fast Gain Control In An Erbium–Doped Fiber Amplifier", by K. Srivastava, Y. Sun, J. L. Zyskind, J. W. Sulhoff, C. Wolf and R. W. Tkach. *Bell Laboratories*, pp. PDP 4–2 –4–5.
"Asymmetric Control Laser Cavity Design For Low Noise Operation of An All–Optical Gain Controlled Erbium–Doped Fibre Amplifier", by J. Massicott, C. Lebre, R. Wyat, R. Kashyap and D. Williams.; FB2–1. p. 77,78.
"Dynamic Compensation Of Transient Gain Saturation In Erbium–doped Fiber Amplifers By Pump Feedback Control", by K. Motoshima, D. N. Chen, L. M. Leba, M. M. Downs, T. Li, and E. Dessurvire. *OFC/100C Technical Digest*. pp. 40–42.

*Primary Examiner*—Mark Hellner
*Attorney, Agent, or Firm*—Julio A. Garceran

[57] ABSTRACT

The dynamic gain control system includes a pump source providing pump light. The dynamic gain control system measures a certain portion of the input pump light into the optical amplifier and measures a certain portion of the output pump light from the optical amplifier. The dynamic gain control determines the pump light loss based on the input pump light and output pump light measurements. Based on the pump light loss, the dynamic gain control system maintains the pump light loss relatively constant (for example 0.1 dB) independent of the number of input channels and their relative powers (for example, input channel powers of +50 dBm to 10 dBm) by providing feedback to control the output pump light. In doing so, the dynamic gain control system maintains the inversion level of the optical amplifier. A relatively constant inversion level corresponds to only small variations in the gains of the input channels (multi-channel gain) as a result of changes in the input channels to the optical amplifier.

21 Claims, 5 Drawing Sheets

DYNAMIC GAIN CONTROL SYSTEM FOR OPTICAL AMPLIFIER AND METHOD THEREOF

BACKGROUND OF THE INVENTION

1. Field of The Invention

This invention relates to optical communications systems and, more particularly, a dynamic gain control system for optical amplifiers.

2. Description of Related Art

Optical communications systems are desired because of the wide bandwidths available for the information signal channels. Speed limitations of optical transmitters and receivers make it difficult to fully exploit this wide bandwidth while making use of a single wavelength. Therefore, large capacity optical transmission systems are in general combining high speed systems on a signal fiber by means of Wavelength Division Multiplexing (WDM) to fill the available bandwidth. In these WDM optical transmission systems in general, rare-earth doped fiber optical amplifiers (such as Erbium or Erbium-Ytterbium doped) are used to compensate for the fiber link and splitting losses. Optical amplifiers under specific conditions add unwanted noise to the system. In addition, rare earth-doped fiber amplifiers present certain challenges for some applications.

Gain transients in optical amplifiers are a major problem for wavelength division multiplexed (WDM) optical systems in which channels are added or dropped either due to network reconfiguration or failures. Adding channels can depress the power of the present channels below the receiver sensitivity. Dropping channels can give rise to error events in the surviving channels because the power of the surviving channels can surpass the thresholds for non-linear effects, such as Stimulated Brillouin Scattering (SBS) which causes unwanted reflections and noise and Four Wave Mixing (FWM) which adds crosstalk between the channels. The error bursts in the surviving or present channels as a result of these power transients are unacceptable to service providers.

Furthermore, the gain for Erbium-doped fiber amplifiers is not uniform over the optical wavelength because the gain of the Erbium-doped amplifier is inherently dependent upon the absorption and emission wavelength spectrum of the Erbium ions in the fiber. This becomes a significant problem in WDM systems where multiple wavelengths are to be amplified simultaneously. As such, there is a need for Erbium-doped fiber amplifiers (EDFAs) with relatively constant multi-channel gains independent of changing WDM input channel numbers, powers, wavelengths and modulation schemes and with low gain variations between the WDM channels. For Erbium-Doped Fibers (EDFs) there exist inversion levels which provide low multi-channel gain variations. The inversion levels refer to the number of inverted or excited Erbium ions/the total number of Erbium ions in the fiber. For the ideal version of an EDFA, the gain variation between the WDM channels is zero. In practice, an EDFA having low multi-channel gain variation can still produce small channel gain variations between the channels (for example, 1 dB) which can be reduced using a passive optical filter, thereby producing a relatively flat and constant EDFA multi-channel gain v. wavelength spectrum within the EDFA's operating wavelength range.

In A. K. Srivastava et al., "Fast Gain Control in an Erbium-Doped Fiber Amplifier," Technical Digest of the Optical Amplifiers and their Applications 1996 Topical Meeting, OAA'96, Postdeadline paper PDP4, an output power control system measures the output power from a channel and drives the pump laser with a feedback loop to keep the output power of the channel relatively constant. This system does not provide real gain control because gain control is provided only for constant input power. The disadvantage of this solution is that it will not work when the channel that is used to measure the output power is dropped itself. Additionally, as mentioned above, this system will not maintain the multi-channel gain and the non-variation of the multi-channel gain spectrum when the input power of the measured channel is changed. In K. Motoshima et al., "Dynamic Compensation of Transient Gain Saturation in Erbium-Doped Fiber Amplifiers by Pump Feedback Control," Optical Fiber Communication Conference (OFC'93), San Jose, Calif., 1993, pp. 40–42, Paper Tu15, a system is described involving an extra probe signal of which the wavelength is located within the EDFA gain wavelength region but outside the possible signal wavelengths to measure and stabilize the gain. Both the input power and the output power of the probe signal are then measured to determine the actual gain. By using a feedback circuit which drives the pump laser diode current and therefore its power, the system is described as making the gain relatively non-varying. The disadvantage of this technique is that an extra DFB laser is needed in every EDFA to provide the probe signal as well as sharp wavelength multiplexers to add and extract the probe signal, thereby increasing the EDFA production costs.

J. Massicott et al., "Asymmetric Control Laser Cavity Design for Low Noise Operation of an All-Optical Gain Controlled Erbium-Doped Fiber Amplifier," Technical Digest of the Optical Amplifiers and their Applications, 1996 Topical Meeting, OAA'96, Paper FB2, pp. 77–80, reports a solution involving optical gain clamping. The use of optical gain clamping, however, requires at least two extra single wavelength optical reflectors. Furthermore, the additional loss at the signal wavelengths caused by the filters and/or reflectors needed for the gain clamping control laser increases the obtainable noise figure and decreases the obtainable output power of the amplifier given the available pump power.

Therefore, an EDFA is needed to overcome the disadvantages of the current systems and with relatively constant multi-channel gains independent of changing WDM input channel numbers, powers, wavelengths and modulation schemes.

SUMMARY OF THE INVENTION

The dynamic gain control system according to the principles of the present invention determines pump light loss and keeps the pump light loss relatively constant for changing input channels. In doing so, the dynamic gain control system maintains the inversion level of the optical amplifier. A relatively constant inversion level corresponds to relatively constant gains for the channels (multi-channel gain) independent of changing input channel numbers, powers, wavelengths and/or modulation schemes.

To accomplish these and other aspects of the present invention, the dynamic gain control system includes a pump source providing pump light. The dynamic gain control system measures a certain portion of the input pump light into the optical amplifier and measures a certain portion of the output pump light from the optical amplifier. The dynamic gain control determines the pump light loss based on the input pump light and output pump light measurements. Based on the pump light loss, the dynamic gain control system maintains the pump light loss relatively constant (for example 0.1 dB) independent of the number of input channels and their relative powers (for example, input channel powers of −50 dBm to 10 dBm) by providing feedback to control the output pump light. As such, the dynamic gain control system reduces multi-channel gain changes as a result of changes in the input channels to the optical amplifier. In accordance with certain embodiments, small gain variations between the channels over a large total input power range can be achieved by compensating the multi-channel wavelength gain spectrum using passive optical filtering techniques.

In accordance with certain embodiments of the present invention, the shape of the output power spectrum of the pump source remains relatively constant (for example, ±5%) when the output power is changed. Controlling the output pump light can be accomplished, for example, by setting the 980 or 1480 nm pump source at a fixed bias current and temperature and using an external modulator or attenuator to vary the output light of the pump source. Alternatively, the pump source can be optically locked to a single wavelength by using a single-wavelength low-percentage reflector (e.g. a 978 nm 4% fiber Bragg grating reflector) and to change the output power of the pump source by controlling the drive current of the pump source. The dynamic control circuitry can be made to have a quick response time (for example, on the order of $\mu$ seconds) to resolve the gain transient problem.

BRIEF DESCRIPTION OF THE DRAWINGS

Other aspects and advantages of the present invention may become apparent upon reading the following detailed description and upon reference to the drawings in which:

FIG. 6 shows measurements of total input power on channel 1 and the output power at 1550'n on channel 2 of an EDFA with the dynamic gain control system switched on.

DETAILED DESCRIPTION OF THE DRAWINGS

An illustrative embodiment of the dynamic gain control system according to the principles of the present invention is described below which includes a dynamic gain control system that maintains or locks the average inversion of an EDF to yield EDFAs with multi-channel gains independent of the changing input channels; such changes include the number of WDM input channels, their powers, their wavelengths and their modulation schemes. Additionally, filtering can be used to remove variations in the gains between the channels of the EDFAs. These features as well as the dynamic nature of the dynamic control using a fast negative feedback loop can also resolve gain transient problems.

The gain as function of wavelength, $\lambda$, is a function of the Erbium-doped fiber length, L, and time- and position averaged inversion of the Erbium ions, $<N>$:

$$G(\lambda)=L*[(\alpha(\lambda)+g*(\lambda))<N>-(\alpha(\lambda)+\delta(\lambda))],$$

where $\alpha(\lambda)$ is the absorption coefficient, $g*(\lambda)$ is the emission coefficient and $\delta(\lambda)$ is the background loss (all in dB/m). A fixed inversion of the Erbium ions in the EDF yields a fixed multi-channel gain profile and pump light loss. Therefore, in this particular embodiment, the inversion level can be locked by keeping the pump power loss $L_p=P_{pump\text{-}in}/P_{pump\text{-}out}$ relatively constant for different WDM input channel powers where $P_{pump\text{-}in}$ is the pump power into the EDFA and $P_{pump\text{-}out}$ is the pump power output from the EDFA.

Figure 1:
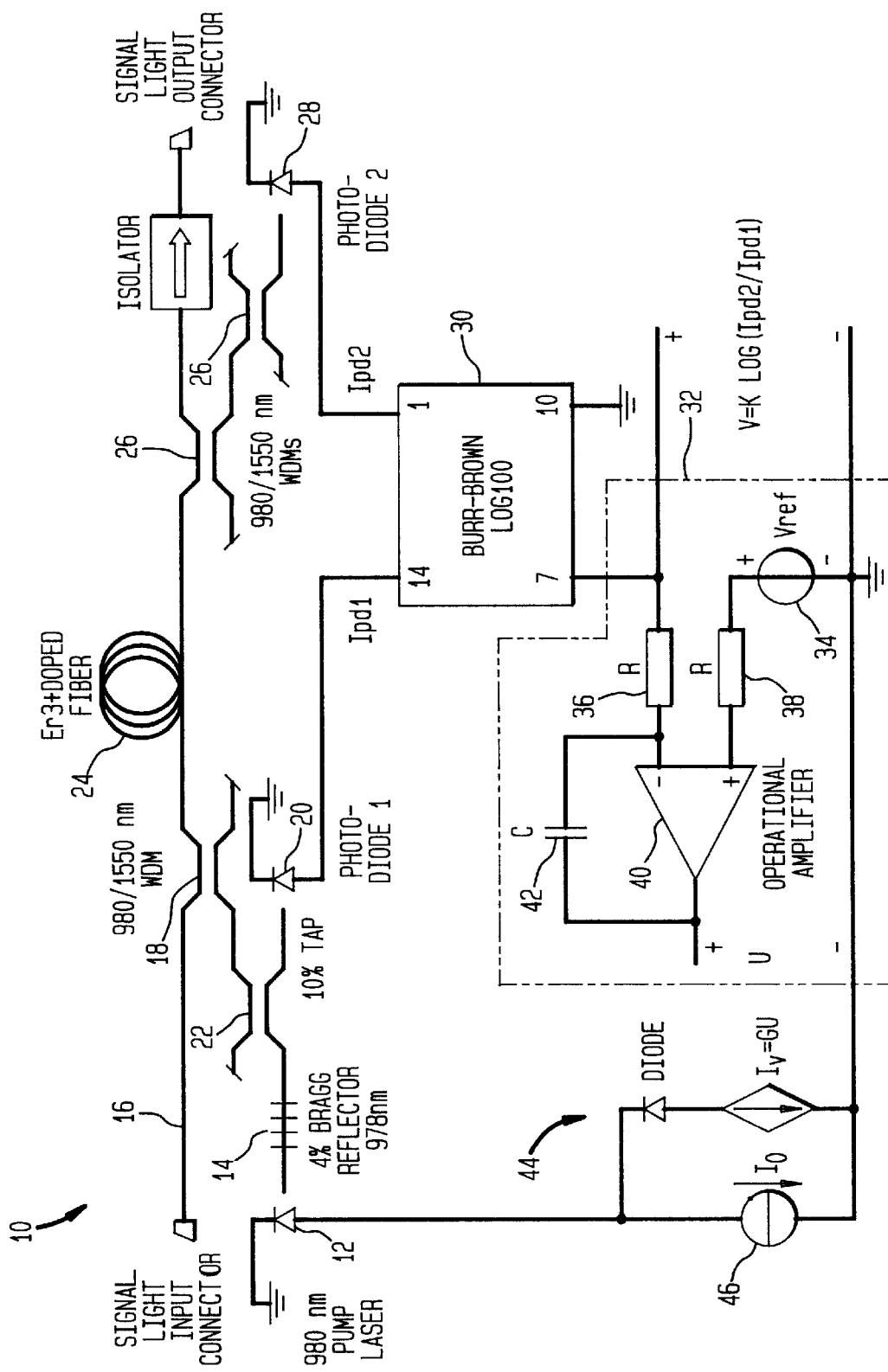
FIG. 1 shows a schematic of an EDFA with an embodiment of the dynamic gain control system according to the principles of the present invention which provides pump light loss-controlled inversion/gain lock.

FIG. 1 shows the schematic of an EDFA 10 using a particular embodiment of the dynamic gain control system according to the principles of the present invention. In this particular embodiment, a pump source 12 is a 980 nm pump laser which produces pump light having a pump power according to a drive current. A single wavelength low-percentage reflector 14, such as a 4% 978 nm fiber Bragg grating reflector, is at the output of the pump source 12 and stabilizes the pump power spectrum. Before combining the input signal on the optical fiber line 16 and the pump power using a 980/1550 nm fused fiber WDM 18, a certain portion (or example, 10%) of the pump power is coupled to a photodetector 20, such as a photodiode, using a tap coupler 22 (e.g., a 10% 980 nm fused fiber tap coupler). As such, in this particular embodiment, the photodetector 20 provides a measure for the input pump power $P_{pump\text{-}in}$ going into the EDF 24. At the output of the EDF 24, a certain portion (100% to a small fraction) of the output pump power is separated from the amplified signal power using WDMs 26 with high isolation (a cascade of two fused fiber WDMs is used in FIG. 1 to achieve this high isolation, for example, 40–50 dB). The separated pump power is coupled to a photodetector 28, such as a photo-diode, to provide a measure for the output pump power $P_{pump\text{-}out}$ of the EDF 26.

Processing circuitry 30 receives an input power signal $I_{pd1}$ from the photodetector 20 representing or indicative of the input pump power and an output power signal from the photodetector 28 representing or indicative of the output pump power $1_{pd2}$. The processing circuitry 30 generates a feedback signal representing or indicative of the pump power loss. In this particular embodiment, the processing circuitry 30 includes a LOG 100 integrated circuit from Burr-Brown® of Tucsan, Ariz. which generates a voltage signal V=K log $(I_{pd2}/I_{pd1})$=K log (C $P_{pump\text{-}out}/P_{pump\text{-}in}$), where K is a set constant produced by the integrated circuit and C is the division by the fraction(s) that $P_{pump\text{-}in}$ and $P_{pump\text{-}out}$ are of the actual input and output pump powers. The feedback signal is received by a negative feedback loop 32 with very high DC loop-gain. In this particular embodiment, the negative feedback loop 32 includes reference voltage source 34, resistors 36 and 38, operational amplifier 40 and capacitor 42.

The negative feedback loop 32 controls the output pump power by driving the variable pump laser diode current $I_v$=GU source 44, where G is the constant that determines the transadmittance of a controlled current source and U is the output of the operational amplifier 40, on top of the bias current $I_o$ source 46. As such, the current $I_v+I_o$ becomes the drive current for the pump source 12 and keeps the voltage signal V equal to the voltage $V_{ref}$. This reference voltage $V_{ref}$ sets the average inversion to which the EDF 24 is locked. The fixed current $I_o$ source 46 is used to bias the pump source 12 above its threshold to assure measurable pump light absorption. The total pump laser current $I_o+I_v$ should be kept below a maximum current $I_{max}$ for the pump laser so as not to destroy the pump laser 12. It is desirable to have a pump source with a kink-free Power-Current (P-I) characteristics. The higher the maximum pump power, the larger the dynamic total signal input power range of the dynamic gain control system because the more input channel power, the more pump power is required to maintain the inversion level and thus the multi-channel gains relatively constant. Alternatively, the feedback loop 32 could provide a feedback signal to a modulator (not shown) or attenuator (not shown) at the output of the pump source 12 to control the output of the pump source 12.

Figure 2:
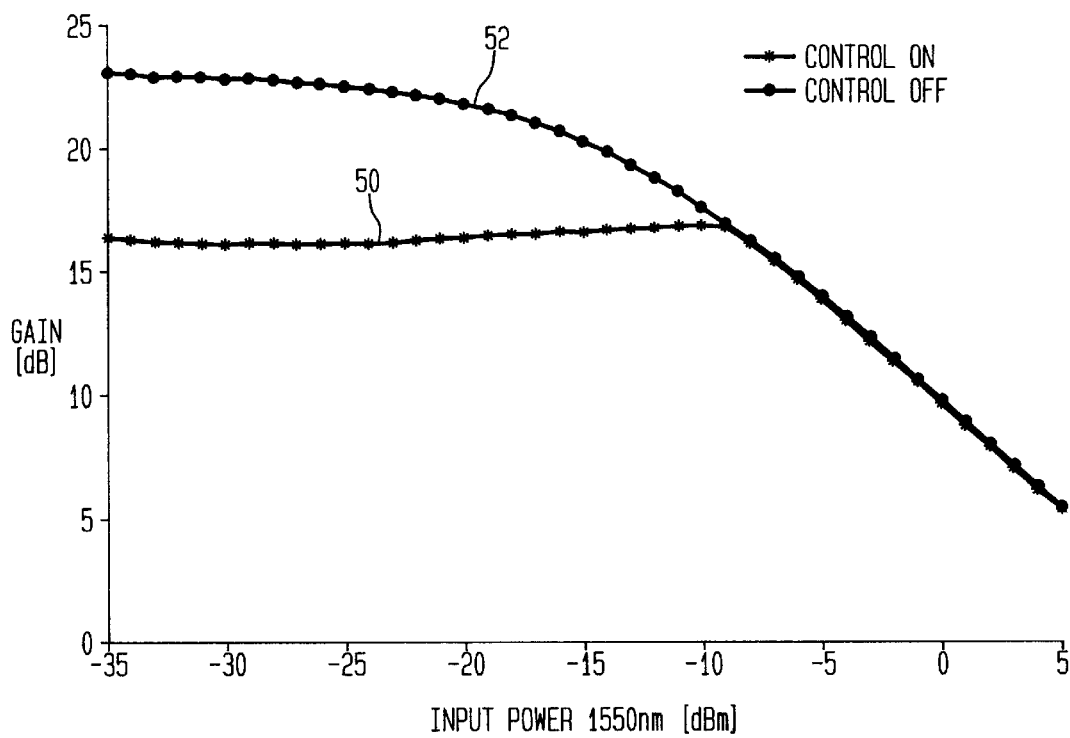
FIG. 2 is a graph plotting EDFA gain as a function of the signal input power at 1550 nm with the dynamic gain control system switched on and off.

FIG. 2 shows two curves with the measured EDFA gain as function of the 1550 nm input signal power into the EDFA. The curve 50 represents the EDFA gain v. input power when the dynamic control circuit is switched on, and the curve 52 represents the EDFA gain v. input power when the pump laser power is fixed to its maximum. As shown by FIG. 2, the dynamic gain control system according to the principles of the present invention maintains the EDFA gain relatively constant at varying input signal powers of approximately −10 dBm to −35 dBm.

Figure 3:
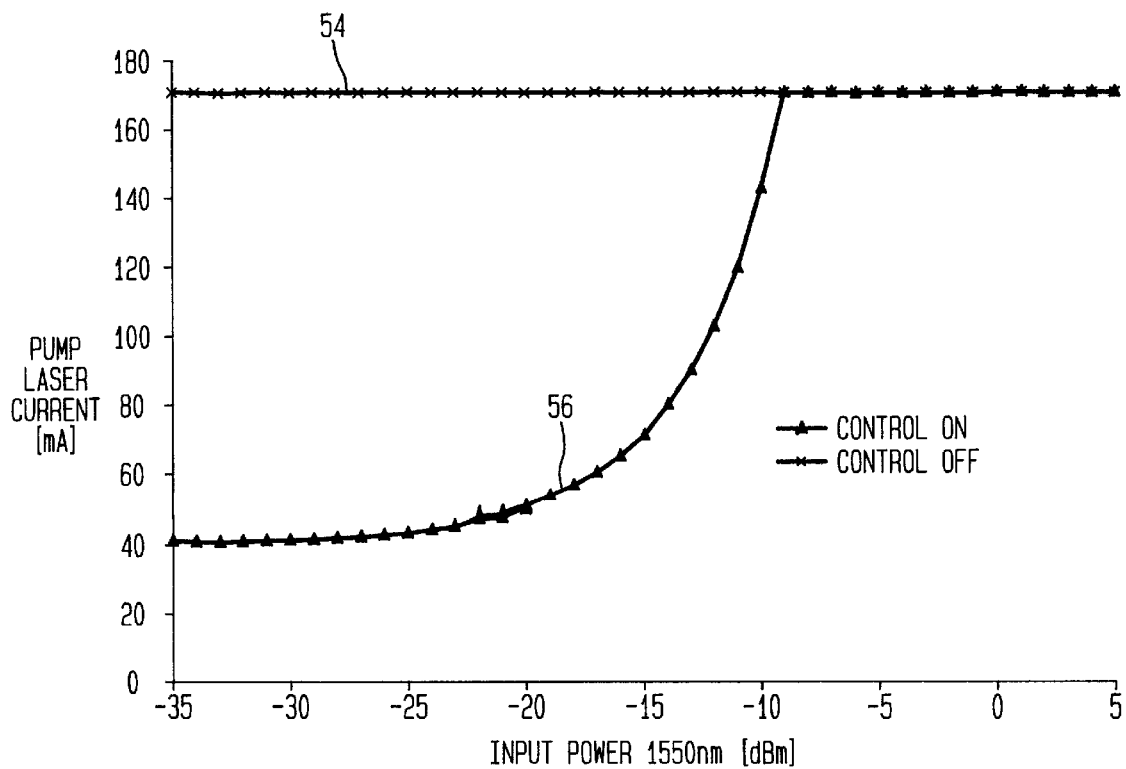
FIG. 3 shows a graph plotting the pump laser current as a function of the signal input power at 1550 nm with the dynamic gain control system switched on and off.

FIG. 3 shows a corresponding plot of input power into the EDFA v. pump source current. The curve 54 represents input power v. pump source current when the dynamic gain control circuit is off and with the pump source current set at the maximum, and the curve 56 represents input power v. pump source current when the dynamic gain control circuitry is activated and with the bias current $I_o$ set to 40 mA. FIG. 3 shows that the dynamic range of the inversion-locked EDFA at this wavelength is about 25 dB (from −35 to −10 dBm). This dynamic range can be expanded by using pump lasers with a higher maximum output power (for the pump laser of this embodiment the maximum output power was approximately 70 mW).

Figure 4:
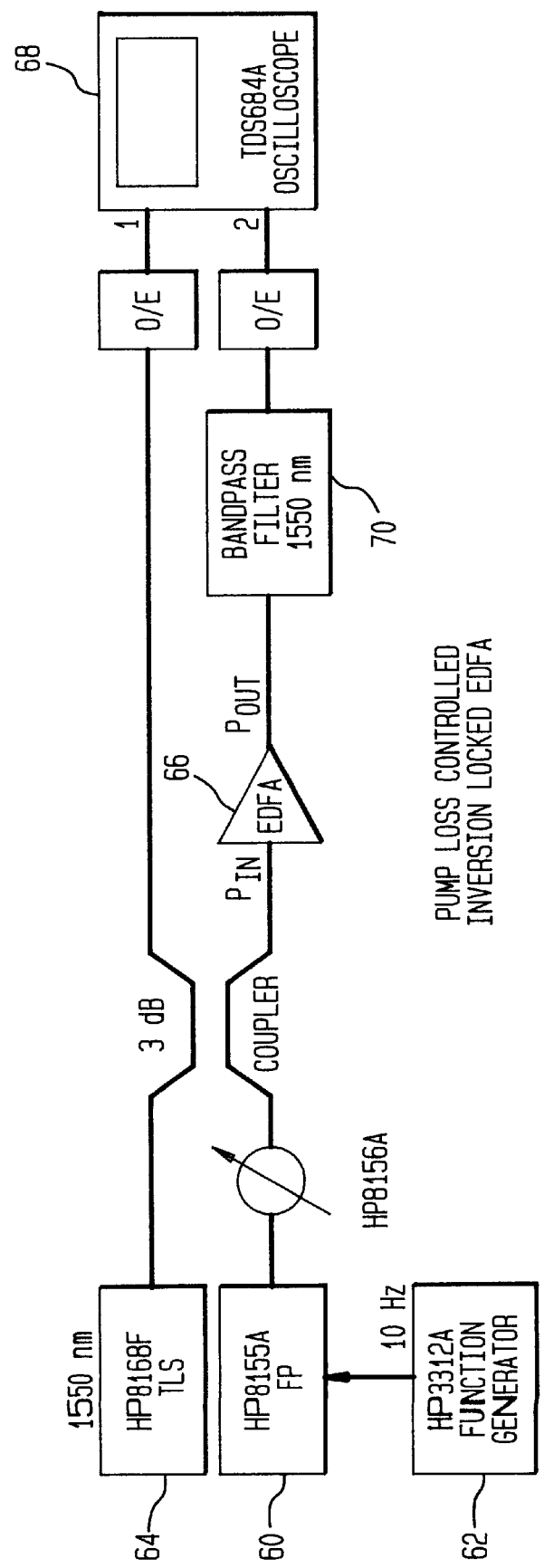
FIG. 4 shows a block diagram of the measurement set-up for an embodiment of the dynamic gain control system.

An example of the dynamic behavior of the dynamic control circuitry for the EDFA of this particular embodiment when channels are added or dropped is described below. FIG. 4 shows the measurement set-up for examining the dynamic behavior of the dynamic gain control system. A 1.55 micron Fabry-Perot laser 60 with $P_i=-11.5$ dBm power of the laser 60 at the EDFA 66 input port and no lasing mode at 1550.0 nm being modulated with a 10 Hz square wave signal. A square wave generator 62 generates the 10 Hz square wave signal which simulates the adding and dropping of 5 out of 6 channels with respect to the 1550.0 nm signal from a tunable laser source 64 with $P_i=-17.5$ dBm power of the tunable laser 64 into the inversion-locked EDFA 66 of this particular embodiment. Using an oscilloscope 68, the total input power (the sum of the Fabry-Perot laser 60 and the tunable laser 64 into the EDFA 66) and the output power of the 1550 nm signal out of the EDFA 66 are measured as a function of time. To measure the output power at 1550 nm, a 0.5 nm bandpass filter 70 tuned to 1550 nm is used.

Figure 5:
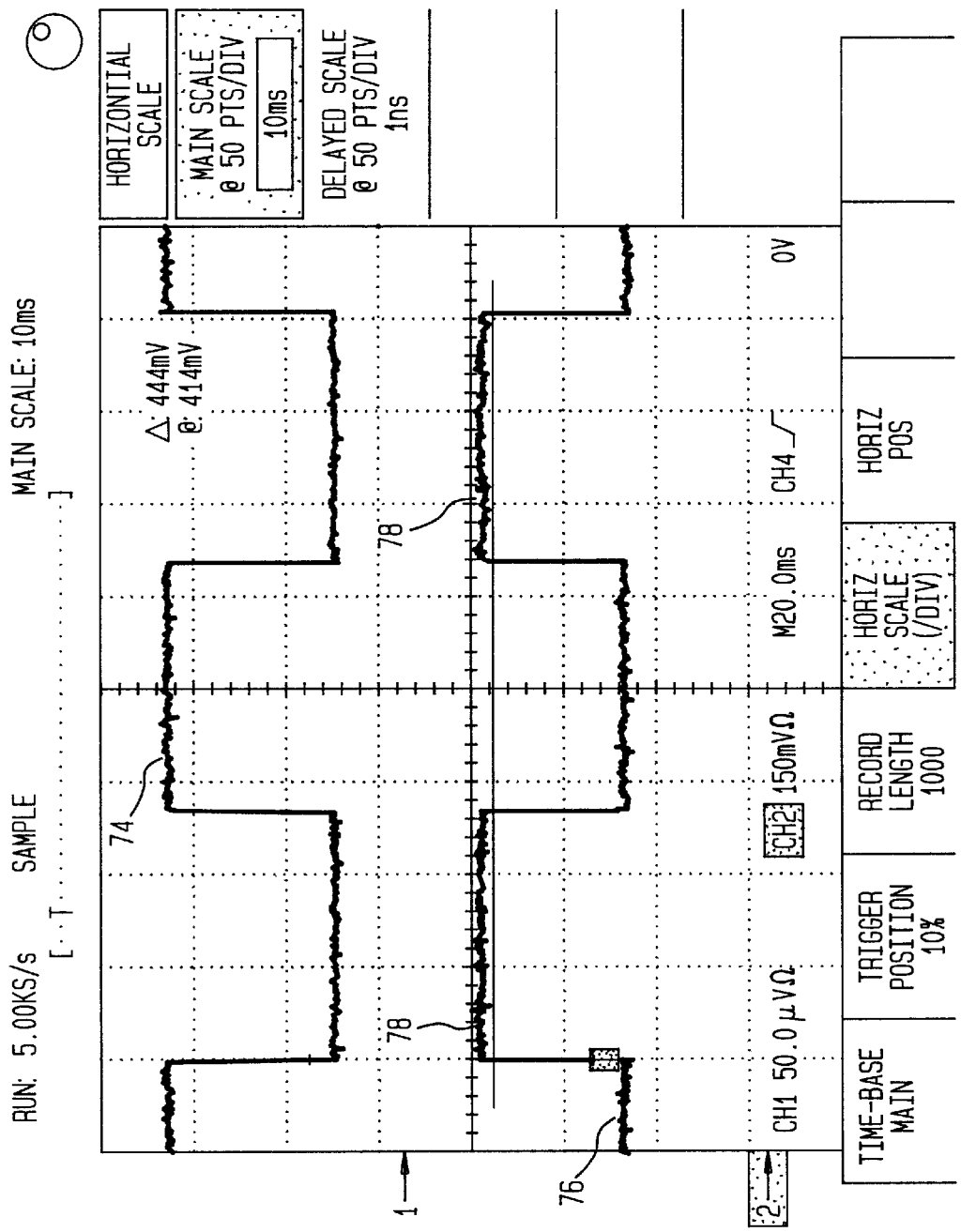
FIG. 5 shows measurements of total input power on channel 1 and the output power at 1550 nm on channel 2 of an EDFA with the dynamic gain control system switched off.

FIG. 5 shows a plot 74 for the total input power on channel 1 of the oscilloscope 68, and a plot 76 for the 1550 nm output power of the EDFA 66 on channel 2 of the oscilloscope 68 with the dynamic control circuit switched off (both power scales are linear). In this case, the output power of the 1550 nm signal rises more than 3 dB when the other channels are dropped during time periods 78.

Figure 6:
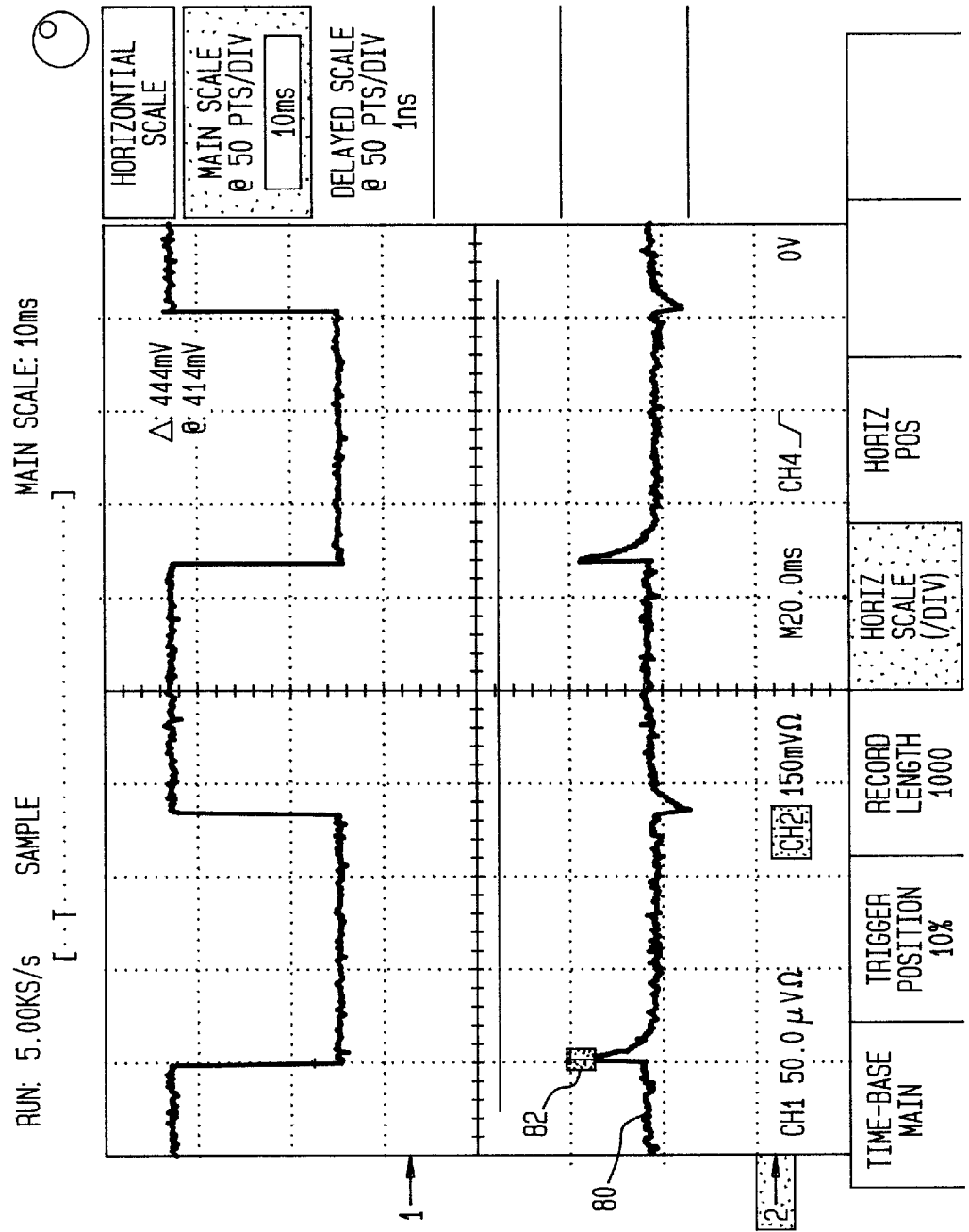

FIG. 6 shows the results when the dynamic control circuitry of this particular embodiment is switched on. In this case, the 1550 nm output 80 is back to its original value within 2 ms and the excursion peak 82 is reduced to approximately 1.7 dB. As such, the plots of FIGS. 5 show how the dynamic control circuit according to the principles of the present invention maintains the gain associated with the 1550 nm output power signal from the EFDA 66 (FIG. 4) during the adding and dropping of channels. By improving response time for the dynamic control circuitry to the order of microseconds, the gain transient performance exhibited by the excursion peaks 82 can be resolved.

Thus, the dynamic gain control system overcomes the disadvantages of current systems and yields an optical amplifier with relatively constant spectral gains independent of the input signals. Alternative configurations of the dynamic gain control system are possible which omit or add components or use different components in performing the above-described control scheme or a variation thereof. For example, the feedback electronics can be improved to provide a faster and smoother response from the dynamic gain control system. Moreover, the above-described embodiment involves a dynamic gain control for an Erbium-doped fiber amplifier, but the dynamic gain control system of the present invention can be used with any other optical amplifiers in which maintaining the spectral gain can be accomplished by measuring the pump light loss and using this as an input signal for a feedback system which controls the output of the pump source(s). As such, the optical amplifier includes other rare earth-doped amplifiers, such as Erbium-doped planar waveguide amplifiers and Erbium-Ytterbium doped amplifiers. Furthermore, the dynamic gain control system is described as measuring input and output pump powers as well as determining pump power loss from these measurements. It should be understood that the measurement of input and output pump powers can be performed by measuring fractions of these values or other parameters related to the actual input and output pump powers and that the determination of pump power loss can be performed by measuring these and other parameters related to pump power loss.

Additionally, the dynamic gain control system has been described as being comprised several simple components, but it should be understood that the dynamic gain control system and portions thereof can be employed using application specific integrated circuits, software driven processing circuitry, or other arrangements of discrete components. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

I claim:

1. A method of controlling an optical amplifier, said method including the steps of:

providing pump light from a pump source;

stabilizing the power spectrum of said pump light from said pump source;

determining pump light loss over said optical amplifier; and controlling said pump source to maintain said pump light loss.

2. The method of claim 1 wherein said step of determining includes the step of:

measuring a portion of input pump light into said optical amplifier;

measuring a portion of output pump light from said optical amplifier; and determining said pump light loss based on said portions of input pump light and output pump light.

3. The method of claim 1 wherein said step of stabilizing including the step of:

maintaining the shape of the power spectrum of said pump light when said pump light changes by setting said pump source at a fixed bias current and temperature.

4. The method of claim 1 wherein said step of stabilizing including the step of:

maintaining the shape of the power spectrum of said pump light when said pump light changes by optically locking the output of said pump source.

5. The method of claim 4 wherein said step of maintaining includes the step of:

using a single-wavelength low-percentage reflector.

6. The method of claim 5 wherein said step of controlling includes the step of:

changing said pump light by controlling a drive current to said pump source.

7. The method of claim 1 further including the step of:

combining at least one input channel with said pump light.

8. The method of claim 2 wherein said step of measuring said portion of said input pump light includes the steps of:

providing said portion of said input pump light to a photodetector; and responding to said input pump light by producing an input light signal representing said input pump light.

9. The method of claim 8 wherein said step of measuring said output pump light includes the steps of:

providing a portion of said output pump light to a second photodetector; and responding to said output pump light by producing an output light signal representing said output pump light.

10. The method of claim 9 wherein said steps of determining and controlling include the steps of:

receiving said input light signal and said output light signal generating a pump light loss signal representing said pump light loss; and providing a negative feedback loop to drive a variable current pump which alters said drive current of said pump source.

11. A method of controlling an optical amplifier, said method including the steps of:

providing pump light from a pump source;

maintaining the power spectrum of said pump light;

measuring a portion of said input pump light into said optical amplifier;

combining input channels with said pump light;

measuring a portion of said output pump light from said optical amplifier;

determining pump light loss based on said measurements of said input pump light and said output pump light; and controlling said pump source by controlling a drive current to said pump source to change said pump light to maintain said pump light loss for changing input signals.

12. The method of claim 11 wherein said step of measuring said portion of said input pump light includes the steps of:

providing said portion of said input pump light to a photodetector; and responding to said input pump light by producing an input light signal representing said input pump light.

13. The method of claim 12 wherein said step of measuring said output pump light includes the steps of:

providing said portion of said output pump power to a second photodetector;

responding to said output pump power by producing an output light signal representing said output pump light.

14. The method of claim 13 wherein said steps of determining and controlling includes the steps of:

receiving said input light signal and said output light signal generating a pump light loss signal; and providing a negative feedback loop to drive a variable current pump which alters said drive current of said pump source.

15. A gain control system for an optical amplifier, said system comprising:

a pump source producing pump light to said optical amplifier;

a power spectrum stabilizer stabilizes the power spectrum of said pump light;

an optical coupling couples a portion of input pump light and provides said portion of said input pump light to a first photodetector, said first photodetector produces an input light signal in response to said input pump light;

a second optical coupling couples a portion of output pump light from said optical amplifier to a second photodetector, said second photodetector produces an output light signal in response to said output pump power; and processing circuitry is coupled to said first and second photodetectors and receives said input light signal and said output light signal to produce a pump light loss signal; and feedback circuitry responsive to said pump light loss signal and controls said pump source to maintain said pump light loss for changing input signals.

16. The system of claim 15 wherein said power spectrum stabilizer includes a fixed biased current source which sets said pump light of said pump source.

17. The system of claim 15 wherein said power spectrum stabilizer includes an optical lock at the output of said pump source to lock said pump light.

18. The system of claim 17 wherein said optical lock is a single-wavelength low-percentage reflector.

19. The system of claim 15 wherein said feedback circuitry controls a drive current to said pump source to change said pump light.

20. A gain control system for an optical amplifier, said system comprising:

a pump source producing pump power to said optical amplifier, said pump source being controlled by a drive current;

a power spectrum stabilizer stabilizes the power spectrum of said pump light;

an optical coupling couples a portion of input pump power and provides said input pump power to a first photodetector, said first photodetector produces an input power signal in response to said input pump power;

a second optical coupling couples a portion of output pump power from said optical amplifier to a second photodetector, said second photodetector produces an output power signal in response to said output pump power; and processing circuitry coupled to said first and second photodetectors and receives said input power signal and said output power signal to produce a pump loss signal; and feedback circuitry responsive to said pump loss signal and controls said pump source by controlling said drive current to said pump source to change said pump power to maintain said pump power loss for changing input signal powers.

21. The system of claim 20 wherein said feedback circuitry being responsive to said pump power loss signal to drive a variable current pump which alters said drive current of said pump source.

* * * * *